(12) United States Patent
Ebel et al.

(10) Patent No.: US 7,617,577 B2
(45) Date of Patent: Nov. 17, 2009

(54) METHOD OF FORMING A LOW COST DIGITAL VARIABLE CAPACITOR

(75) Inventors: John L. Ebel, Centerville, OH (US); Rebecca Cortez, Xenia, OH (US); Richard E. Strawser, Greenville, OH (US); Kevin D. Leedy, Centerville, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 319 days.

(21) Appl. No.: 11/216,261

(22) Filed: Aug. 31, 2005

(65) Prior Publication Data
US 2007/0044289 A1 Mar. 1, 2007

(51) Int. Cl.
*H01G 7/00* (2006.01)
(52) U.S. Cl. .................. 29/25.42; 29/594; 29/609.1; 75/414; 204/192.15; 361/505; 361/523; 427/79; 427/80; 427/128; 427/402
(58) Field of Classification Search ............. 29/25.42, 29/592.1, 609, 832, 852, 855; 75/414; 204/192.15; 361/505, 523; 427/79, 80, 128, 382.2, 402
See application file for complete search history.

(56) References Cited
U.S. PATENT DOCUMENTS
6,249,073 B1 * 6/2001 Nguyen et al. ............. 310/309

| | | | |
|---|---|---|---|
| 6,593,672 B2 | 7/2003 | Ma et al. | |
| 6,667,506 B1 | 12/2003 | Reedy et al. | |
| 6,762,481 B2 | 7/2004 | Liu et al. | |
| 6,818,959 B2 | 11/2004 | Montelius et al. | |
| 6,910,266 B2 * | 6/2005 | Lee et al. ................ | 29/832 |
| 6,954,301 B2 * | 10/2005 | Nguyen et al. ........... | 359/290 |
| 2005/0173619 A1 * | 8/2005 | Berg et al. ............... | 250/214.1 |

OTHER PUBLICATIONS

Eurosensors XVIII 4-State Digital Variable Capacitors by J.R. Reid, L.A. Starman, and R.T. Webster, Sep. 2004, pp. 405-406.

(Continued)

*Primary Examiner*—Paul D Kim
(74) *Attorney, Agent, or Firm*—AFMCLO/JAZ; Robert V. Klauzinski (57) ABSTRACT

A digital variable capacitor package is provided as having a ground plane disposed on predetermined portion of the top surface of a substrate. An elongated signal electrode may also be disposed on the substrate and including a first end defining an input and a second end extending to a substantially central region of the top surface of the substrate. This elongated signal electrode is disposed to be electrically isolated from the ground plane. A number of elongated cantilevers are disposed on the substrate and each include first ends coupled to the second end of the signal electrode and each further include second ends suspended over different predetermined portions of the ground plane. In operation, one or more of the cantilevers may be actuated to move portion thereof into close proximity to the ground plane for providing one or more discrete capacitance values.

10 Claims, 7 Drawing Sheets

OTHER PUBLICATIONS

MTT-S Design and Modeling of RF MEMS Tunable Capacitors Using Electro-Thermal Actuators by Z. Feng et al., pp. 1507-1510, 1999.

MTT-S Digitally Controllable Variable High-Q MEMS Capacitor for RF Applications by N. Hovik et al., pp. 2115-2118, 2002.

MTT-S High-Q Millimeter-Wave MEMS Varactors: Extended Tuning Range and Discrete-Position Designs by L. Dussopt and G.M. Rebeiz, pp. 1205-1208, 2001.

Integrated Systems Laboratory A Zipper-Action Differential Micro-Mechanical Tunable Capacitor by G.V. Ionis, A. Dec, K. Suyama, 2002, pp. 29-32.

Integrated Systems Laboratory Differential Multi-Finger MEMS Tunable Capacitors for RF Integrated Circuits by G.V. Ionis, A. Dec, K. Suyama, 2002, pp. 345-348.

Topical RF MEMS from a device perspective by J. Jason Yao, Apr. 12, 2000, p. R9-R38.

* cited by examiner

(Table - 1)

| Parameter | Cap 1 | Cap 2 | Cap 3 | Value |
|---|---|---|---|---|
| $C_{v,0}$ | Up | Up | Up | 153.8 fF |
| $C_{v,1}$ | Down | Up | Up | 202.3 fF |
| $C_{v,2}$ | Down | Down | Up | 235.2 fF |
| $C_{v,3}$ | Down | Down | Down | 261.3 fF |

FIG.8

(Table - 2)

| | $I_b$ | $W_b$ | $V_{pi,}$ Nominal | $V_{pi,}$ Meas. |
|---|---|---|---|---|
| Cap. 1 | 205 | 35 | 25.4 | 18.7 |
| Cap. 2 | 175 | 35 | 31.0 | 28.0 |
| Cap. 3 | 175 | 45 | 35.1 | 33.2 |

FIG.9

METHOD OF FORMING A LOW COST DIGITAL VARIABLE CAPACITOR

STATEMENT OF GOVERNMENT INTEREST

The invention described herein may be manufactured and used by or for the Government for governmental purposes without the payment of any royalty thereon.

FIELD OF THE INVENTION

The present invention relates generally to micro-electromechanical (MEM) systems and microwave components and, more particularly, to a low cost digital variable capacitor.

BACKGROUND OF THE INVENTION

MEM variable capacitors can be implemented in both analog and digital configurations. Analog variable capacitors have the advantage that they can be tuned to any value in their capacitance range. However, they are subject to capacitance variations resulting from voltage fluctuations on the control line. Further, the tuning range of analog variable capacitors is typically limited by the pull-in phenomena associated with electrostatic parallel-plate actuators. Digital MEM variable capacitors have been demonstrated using switching networks with very high capacitance ratios (>10). Unfortunately, the switches introduce a small resistance that limits the ultimate Quality (Q) values or Q factors of the devices. Further, the size of a switching network and multiple capacitors limits the maximum frequency for which the device can operate. Digital MEM variable capacitors have also been implemented using mechanical standoffs to create capacitors with fixed up and down states. In these devices, multiple mechanical structures are used to create multiple digital states. These devices are controlled using individual control lines with one control line designated to each state. This requires a large number of control lines for each digital capacitor and limits the application of the devices in large numbers.

It would, therefore, be desirable to overcome the aforesaid and other disadvantages.

SUMMARY OF THE INVENTION

In one aspect of the present invention, set forth is a digital variable capacitor including a ground plane disposed on a substrate. An elongated signal electrode is also disposed on the substrate and includes a first end defining an input and a second end extending to a substantially central region of the substrate. In this arrangement, the elongated signal electrode is disposed to be electrically isolated from the ground plane. A number of elongated cantilevers are disposed on the substrate. Each of the cantilevers have a first end coupled to the second end of the signal electrode. Furthermore, each of the cantilevers have a second end suspended over different predetermined portions of the ground plane. In this arrangement, the first end of the electrode is adapted to receive one or more control values operative to actuate at least one of the number of cantilevers to position the second end thereof in relatively close proximity to the ground plane for providing at least a first predetermined capacitance value between the input defined at the first end of the signal electrode and the ground plane.

In another aspect of the present invention, set forth is a method of forming a digital variable capacitor. The method includes disposing and patterning a relatively thin metal layer on a relatively thick wafer substrate to form at least one signal electrode and at least one ground plane region, which includes a notched portion. In an embodiment, disposing and patterning the relatively thin metal layer may be accomplished by using an evaporation process. Furthermore, the thin metal layer may include a thin layer of gold, which may be patterned using a lift off process.

A sacrificial layer is disposed and patterned over portions of the signal electrode and the ground plane region. In an embodiment, the sacrificial layer may include polymethylglutarimide disposed and patterned over portions of the signal electrode and the ground plane region using a spin coating process. Thereafter the polymethylglutarimide can be permitted to cure. After the polymethylglutarimide cures, the polymethylglutarimide can be patterned using a photo-lithographic process.

At least one via or dimple may be etched in the sacrificial layer over and substantially aligned with the notched region defined on the ground plane region. In an embodiment, the via or dimple can be etched in the sacrificial lever using a photolithographic process to a depth of approximately one micrometer.

A relatively thick metal layer may be disposed over the signal electrode and/or sacrificial layer. The sacrificial layer may thereafter be etched away for forming a number of cantilevers. Each of the cantilevers include a first end coupled to a signal electrode and each of the number of cantilevers include a second end suspended over different predetermined portions of the ground plane. In this arrangement, the signal electrode is adapted to receive one or more control values operative to actuate at least one of the number of cantilevers to position the second end thereof in relative close proximity to the ground plane for providing at least a first predetermined capacitance between the signal electrode and the ground plane.

BRIEF DESCRIPTION OF THE DRAWINGS

The invention will be more fully understood from the following detailed description taken in conjunction with the accompanying drawings, in which:

FIGS. 3a-3f show one embodiment of a method of forming the digital variable capacitor of FIG. 1;

DETAILED DESCRIPTION OF THE INVENTION

The present invention provides a digital variable capacitor and method of manufacturing the same. The digital variable capacitor is constructed and arranged to provide a number of discrete capacitance values using a single control electrode, which reduces dimensions and complexity. The digital variable capacitor may be employed for phase shifting, impedance matching and/or other tuning related features for a number of relatively high frequency transmission lines, devices and systems. As will be described in further detail below, suffice it say here, the digital variable capacitor includes three separate cantilevers that are constructed and arranged to pull-in at three different voltages, such as 25 Volts, 31 Volts, and 35 Volts, which operates to provide four distinct capacitance states (2-bit equivalent).

Figure 1:
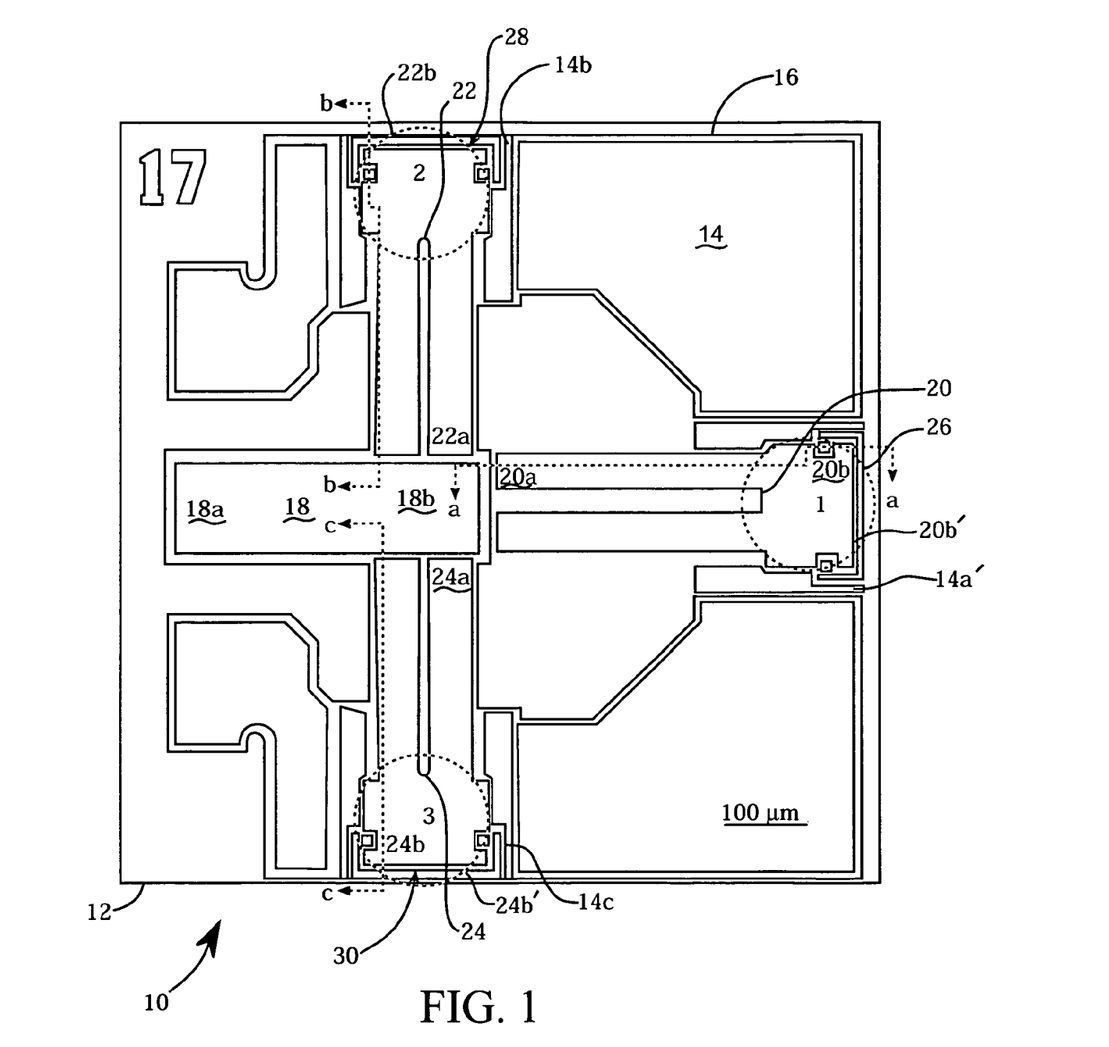
FIG. 1 shows an embodiment of the digital variable capacitor in accordance with the present invention.

Referring now to FIG. 1, shown is one embodiment of the digital variable capacitor package 10 in accordance with principles of the present invention. In the illustrative embodiment, the digital variable capacitor package 10 includes a substrate 12. In an embodiment, the substrate 12 can be formed of sapphire, glass or other sturdy dielectric materials and may include the dimensions of approximately 535 µm by 586 µm. A ground plane 14 may be disposed along an edge region 16 of the substrate 12 and may include first, second and third stepped regions 14a, 14b, 14c.

A single elongated electrode 18 is also disposed on the substrate 12 and includes a first end 18a defining an input and a second end 18b extending to a central region of the substrate 12. The second end 18b of the electrode 18 is electrically coupled to first ends 20a, 22a, 24a of respective first, second and third elongated cantilevers 20, 22, 24. A second end 20b, 22b, 24b of each of the respective first, second and third elongated cantilevers 20, 22, 24 includes a capacitance plate portion 20b', 22b', 24b'. In the illustrative embodiment, a first digital capacitor 26 is formed between the capacitance plate portion 20b defined at the second end 20b of the first cantilever 20 and the first stepped portion 14a of the ground plane 14. Further, a second digital capacitor 28 is formed between the capacitance plate portion 22b' defined at the second end 22b of the second cantilever 22 and the second stepped portion 14b of the ground plane 14. Similarly, a third digital capacitor 30 is formed between the capacitance plate portion 24b' defined at the second end 24b of the third cantilever 24 and the third stepped 14c portion of the ground plane 14.

Figure 2A:
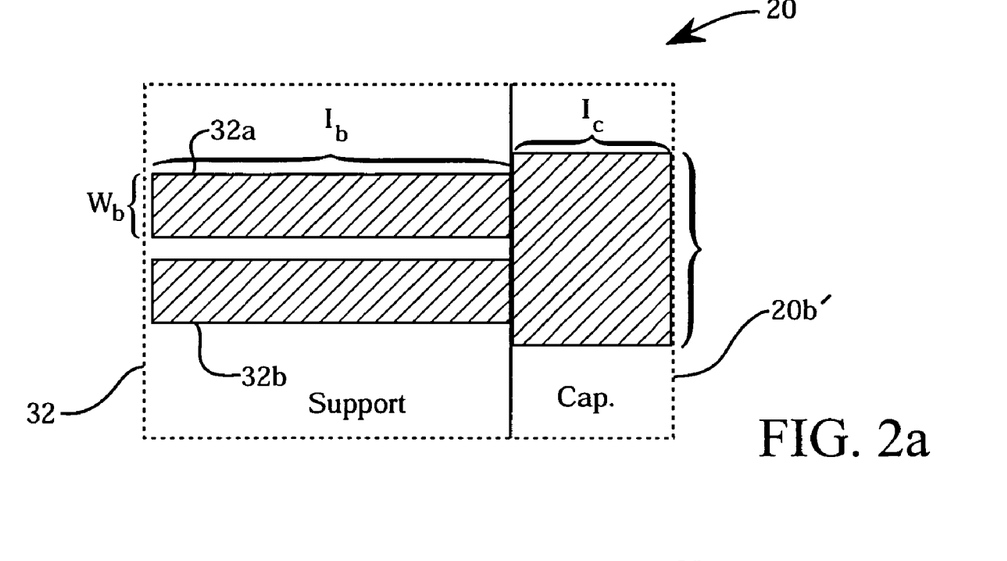
FIGS. 2a and 2b respectively show a top view of one of the cantilevers and a corresponding cross-sectional view of the cantilever and ground plane, which are included on the digital variable capacitor package of FIG. 1.
Figure 2B:
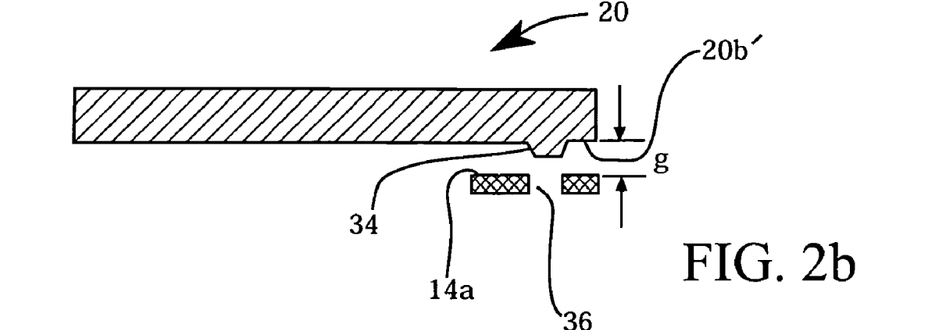

Referring to FIGS. 2a and 2b collectively, respectively shown are a top plan view of the first cantilever 20 and a cross-sectional view of the first cantilever 20 taken through lines a-a (FIG. 1). It should be understood that the first cantilever 20 is shown and described in FIGS. 2a and 2b for illustrative purposes and that the second 22 and third 24 cantilevers may be similarly constructed and arranged. In FIG. 2a, the first cantilever 20 includes a support portion 32 and a capacitance plate portion 20b'. The support portion 32 of the first cantilever 20 includes a pair of parallel support members 32a, 32b, each of which includes a length $I_b$ and a width $W_b$. The pair of support member 32a, 32b are adapted to receive a voltage potential from a D.C. control source (not shown), via the elongated electrode 18 (FIG. 1), and to deflect, deform and/or otherwise bend downwardly a predetermined distance based on a function of their dimensions, i.e., length $I_b$ and a width $W_b$, to position the capacitance plate portion 20b' in close proximity to the corresponding stepped portion 14a of the ground plane 14.

The capacitance plate portion 20b' of the first cantilever 20 similarly includes a predetermined length $I_c$ and width $W_c$. The length $I_c$ and width $W_c$ of the capacitance plate portion 20b of the first cantilever 20 may be adjusted to form a predetermined capacitance between the capacitance plate portion 20b and corresponding stepped portion 14a of the ground plane 14 when the pair of support member 32a, 32b are actuated to position the capacitance plate portion 20b' in close proximity to the stepped portion 14a of the ground plane 14, as described above.

In an embodiment, each pair of parallel support members associated with each of the first, second and third cantilevers 20, 22, 24 include different dimensions to provide for adjustment as to the pull-in voltage of each corresponding capacitance plate portion 20b', 22b', 24b'. For example, dimensions of the support members (eg., support members 32a, 32b) and the associated pull-in voltages are provided in Table 1. Each capacitance plate portion 20b', 22b', 24b' associated with the first, second and third cantilevers 20, 22, 24 include equivalent dimensions of approximately $I_c$=100 µm and $w_c$=75 µm.

At least one protrusion 34 may be formed on a bottom surface 20b" of the capacitance plate portion 20b', which faces the stepped region 14a of the ground plane 14. The protrusion 34 formed on the bottom portion 20b" of the capacitance plate portion 20b' is dimensioned to be accepted into a notched region 36 formed on the stepped region 14a of the ground plane 14 for providing a positive downward stop position for the capacitive plate portion 20b' of the first cantilever 20.

FIGS. 3a through 3e show one embodiment of a method 100 for forming the digital variable capacitor 10 of the present invention. Generally, the digital variable capacitor package 10 is fabricated using a sacrificial release process designed to fabricate metal contact switches. The method 100 may use four layers and five photolithography masks. In order to simplify the description of the method 100, FIGS. 3a through 3e illustrate a cross-section view of the fabrication process for the first cantilever 20 and although the second and third cantilever 22, 24 are not specifically shown, it should be understood that the second and third cantilevers are present and are similarly constructed and arranged as the first cantilever 20.

Figure 3A:
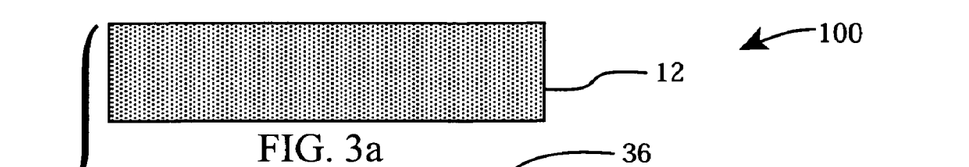
Figure 3B:
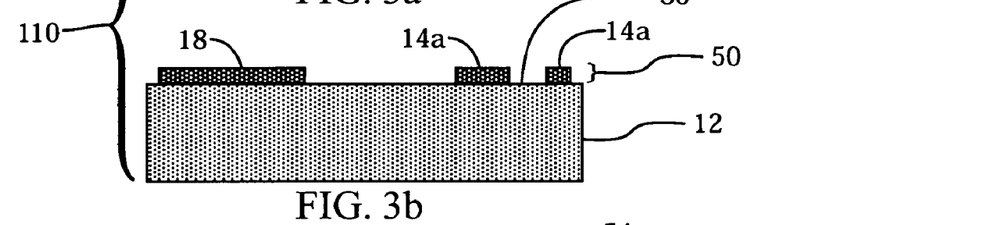

In FIGS. 3a and 3b, fabrication begins at step 110 with the deposition of a thin gold layer (≈0.3 µm) 50 on the substrate 12 to form the control signal electrode and ground plane. In an embodiment, an evaporation process may be used for disposing the thin gold metal layer on the substrate 12. Thereafter, a lift off process may be used for patterning the thin gold metal layer.

Figure 3C:
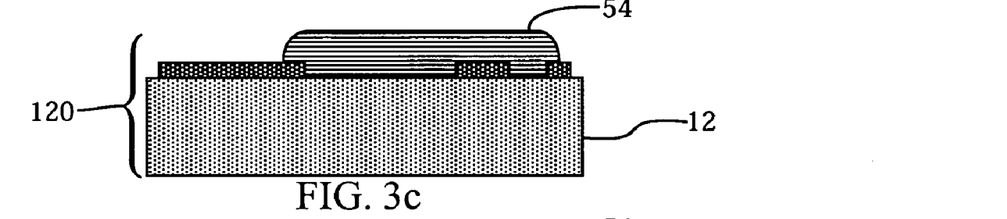

In FIG. 3c and at step 120, an optional resistor layer may be disposed for forming resistive bias lines. Although the optional resistor layer is not shown, it should be understood that the optional resistor layer may be disposed when banks of capacitors are going to be used simultaneously. Resistive bias lines may be used as RF blocks, and can be used equally well for one or more devices. The resistor layer may not be needed for some applications of digital variable capacitor package, however, if the capacitor is implemented into microwave circuits, resistive bias lines may become necessary. The resistor layer is followed by a sacrificial layer 54 of polymethylglutarimide (PMGI). In an embodiment, the sacrificial layer 54 may be approximately 3.0 µm in thickness. In an embodiment, the sacrificial layer 54 of PMGI can be disposed over portions of the signal electrode 18 and the ground plane 14 region using a spin coating process and the PMGI can be permitted to cure. Thereafter, the sacrificial layer 54 of PMGI can be patterned using a photolithographic process.

Figure 3D:
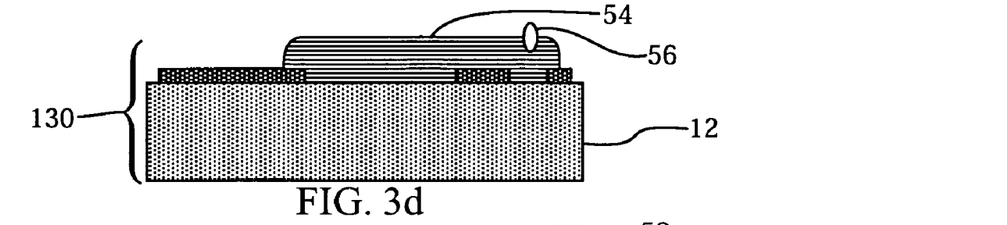
Figure 3E:
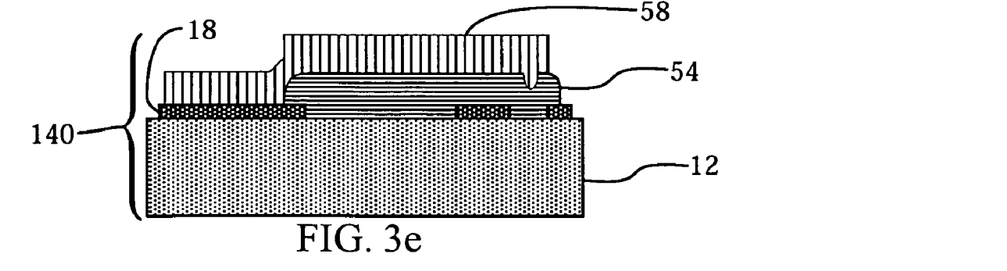

In FIG. 3d and at step 130, a via 56 is then etched into the sacrificial layer 54 to a depth of approximately 1.0 µm. In FIG. 3e and at step 140, a relatively thick layer of gold 58 or other suitable metal or metal alloy may be disposed over the control signal electrode 18 and sacrificial layer 54 using an electroplating process. In an embodiment, the relatively thick layer of gold 58 or other suitable metal or metal alloy may be approximately 5.0 μm in thickness. Thereafter, the relatively thick layer of gold 58 or other suitable metal or metal alloy may be may be patterned to form the first cantilever 20 and/or any other mechanical devices, as shown below with respect to FIG. 3f.

Figure 3F:
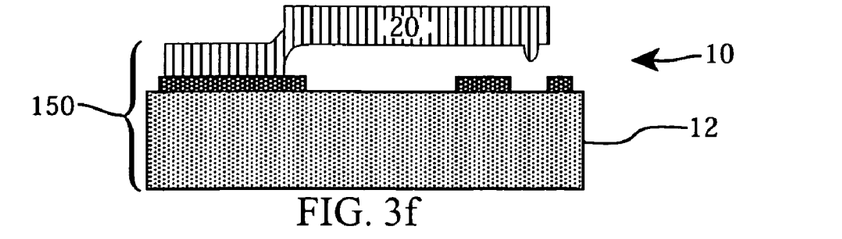

In FIG. 3f and at step 150, a wet chemical etching and/or solvent process is employed to remove the sacrificial layer 54, which operates to free the first cantilever 20 and/or any other mechanical structures formed on the substrate 12. Optionally, the wet chemical etching and/or solvent process may be followed by a drying process, which uses a $CO_2$ critical point dryer to minimize stiction while drying the digital variable capacitance package 10. In an embodiment, a PMGI stripping agent may be used during the wet chemical etching and/or solvent process for removal of the sacrificial layer 54.

Figure 4:
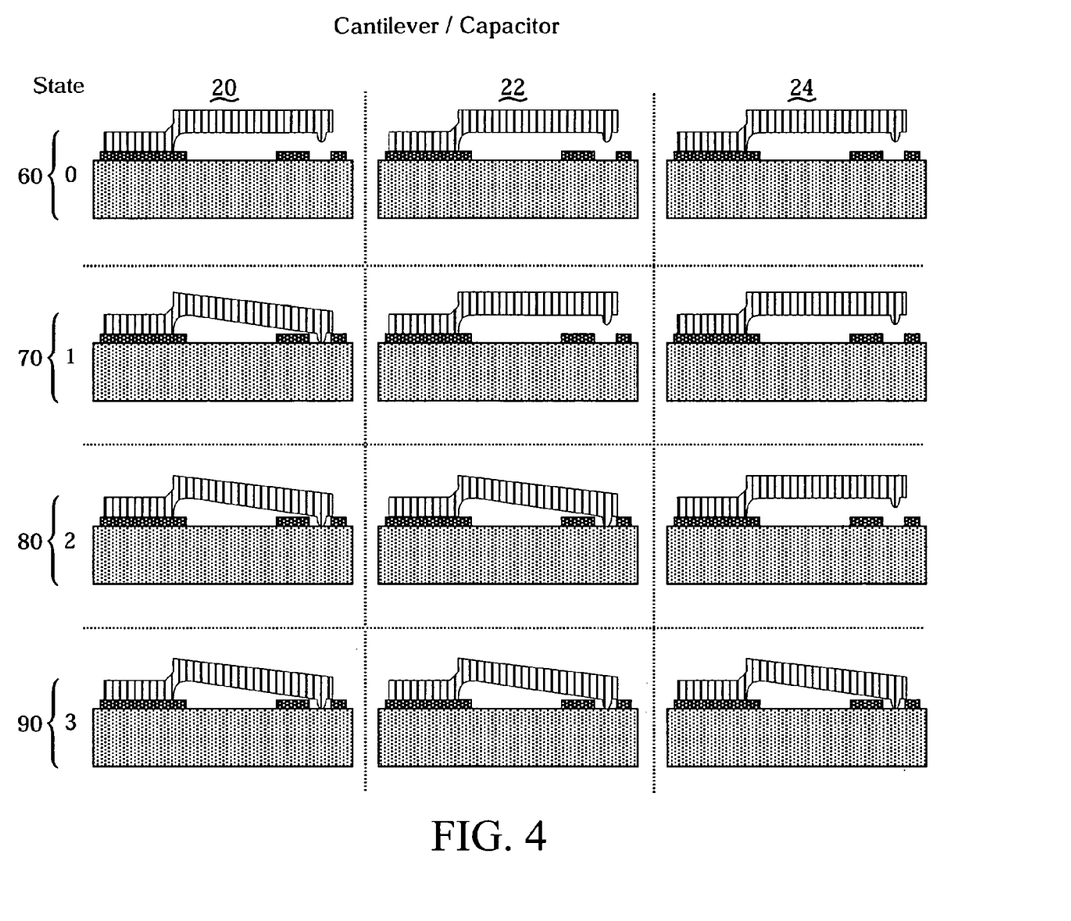
FIG. 4 shows an exemplary sequence of operation of the cantilevers included on the digital variable capacitor package of FIG. 1.

Referring to FIG. 4, shown is a cross sectional view of each of the first, second and third cantilevers 20, 22, 24, respectively taken through lines a-a, b-b and c-c of FIG. 1. The first, second and third cantilevers 20, 22, 24, are constructed and arranged to sequentially pull in or actuate to an on-state when an increasing D.C. control voltage is applied to the signal electrode 18 (FIG. 1). In FIG. 4, the columns represents each of the first, second and third cantilevers and the rows represent the first, second and third cantilevers 20, 22, 24 in various states (e.g., digital high state or digital low state).

In the exemplary embodiment, the sequence of operation of the digital variable capacitor package 10 includes State-0, as shown in row 60, representing the first, second and third cantilevers 20, 22, 24 in off states (i.e., digital states: 0,0,0). State-1, as shown in row 70, represents the first cantilever 20 actuated to an on-state, while the second and third cantilevers 22, 24 are in a non-actuated or off-state (i.e., digital states: 1,0,0). State-2 as shown in row 80, represents the first and second cantilevers 20, 22 actuated to an on-state, while the third cantilever 24 is in a non-actuated or off-state (i.e., digital states: 1,1,0). State-3, as shown in row 90, represents the first, second and third cantilevers 20, 22, 24 actuated to an on-state (i.e., digital states: 1,1,1).

Figure 5A:
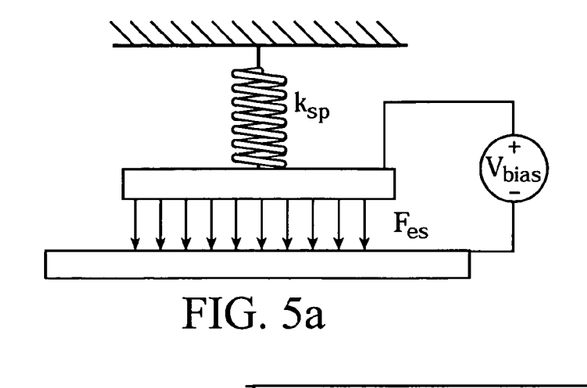
FIGS. 5a and 5b respectively show a spring force model used to determine dimensions of the cantilevers included on the digital variable capacitor package of FIG. 1.
Figure 5B:
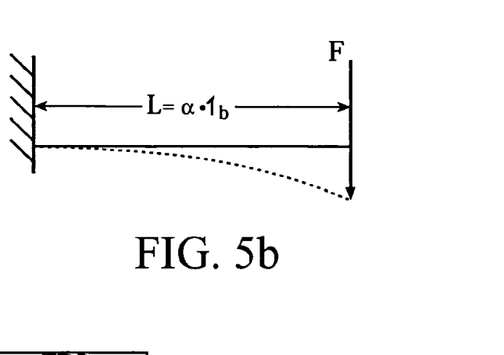

The first, second and third cantilevers 20, 22, 24 are constructed and arranged to pull-in at voltage levels below 40 Volts, and the pull-in voltages are all separated by at least 2.5 Volts. The pull-in voltage of the first, second and third cantilevers 20, 22, 24 may be calculated using a one dimensional linear spring model, as shown in FIGS. 5a and 5b. This model makes three simplifying assumptions: first, that the force applied to each cantilever 20, 22, or 24 is a point force applied to the cantilever 20, 22, or 24 at a distance, $\alpha \cdot l_b$, from the cantilever support member; such as support members 32a and 32b of FIG. 2a, second that the spring constant of the support region can be assumed valid for this entire length, and third that the force can be calculated assuming that the gap "g" (FIG. 2b) is constant across the capacitor plate region. These assumptions introduce systematic errors into the calculation of the pull-in voltage. However, beam thickness and the gap across a fabricated wafer result in variations in the pull-in voltage on the order of ±10%. In addition, run to run variation of the pull-in voltage may be greater than ±15%. This modeling is directed to verifying and ensuring that the three capacitors (e.g., first, second, and third digital capacitors 26, 28, 30 (FIG. 1) of each of the first, second and third cantilevers 20, 22, 24) have separate pull-in voltages to ensure four distinct capacitance states as shown and described above with respect to FIG. 4.

Figure 8:
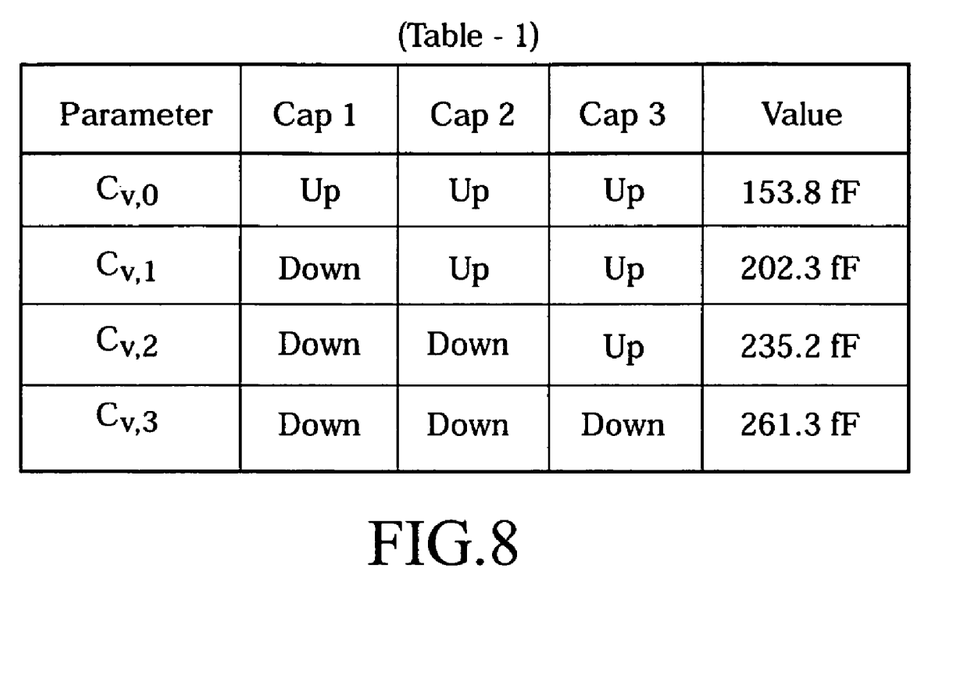
FIG. 8 shows a table (Table-1) representing exemplary digital capacitance values corresponding to each of the four possible digital capacitance states of FIG. 7.
Figure 9:
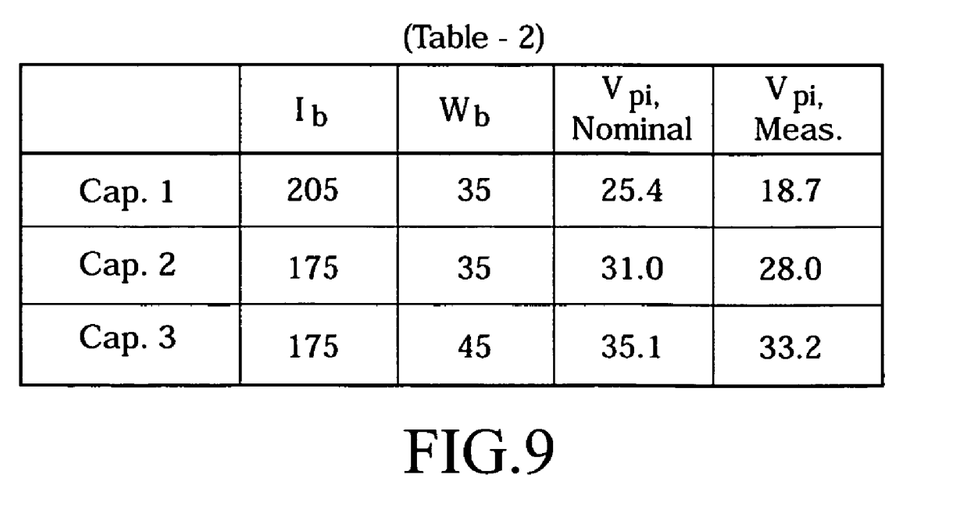
FIG. 9 shows a table (Table-2) representing exemplary physical dimension values and bias voltages for each of the cantilevers included on the digital variable capacitor package of FIG. 1.

The spring constant, $k_{sp}$, is calculated as $$k_{sp} = \frac{3 \cdot E \cdot I}{(\alpha \cdot l_b)^3} \quad (1)$$

where E is the Young's modulus of gold (70 GPa), I is the moment of inertia as calculated below, and $\alpha \cdot l_b$ is effective length of the beam, also calculated below. As described above, it is assumed that the moment of inertia of the spring is constant over the entire effective length. The moment of inertia is then calculated as follows:

$$I = \frac{2 \cdot w_b \cdot t^3}{12} \quad (2)$$

where $2 \cdot w_b$ is the width of the support cross section and t is the thickness of the beam metal. This value is accurate for the support region of the cantilever, but is not accurate for the capacitor model. In the first, second and third cantilevers 20, 22, 24 of the present invention, the moment of inertia in the support member region (32 of FIG. 2a) may be approximately 1.43, 1.43, and 1.11 times the moment of inertia in the capacitor region (20b of FIG. 2a) for the first, second and third cantilevers 20, 22, 24, respectively. However, the bending moment applied to each cantilever 20, 22, or 24 has its maximum value in the support region 32 and thus the resulting error is a very small underestimate of the spring constant. The effective length of each cantilever is $\alpha \cdot l_b$. The factor $\alpha$ is calculated as:

$$\alpha = 1 + \frac{l_c}{2 \cdot l_b} \quad (3)$$

where $l_b$ and $l_c$ are the lengths of the support members 32a, 32b (FIG. 2a) and capacitor plate regions 20b (FIG. 2a), respectively. This value is set so that the moment in the support region 32 is accurately calculated for an equally distributed force in the capacitor plate region 20b'. The moment in the capacitor plate region 20b' is not accurate, but as mentioned, the moment in this region is relatively low and does not have a large influence on the total deflection of the first, second or third cantilevers 20, 22, 24. Utilizing the equations above, the spring constant is calculated for each of the first, second and third cantilevers 20, 22, 24. Finally, the pull-in voltage is calculated as:

$$V_{pi} = \sqrt{\frac{4 \cdot k_{sp} \cdot g_0^3}{27 \cdot \varepsilon_0 \cdot l_c \cdot w_c}} \quad (4)$$

where $\sigma_0$ is the permittivity of free space and $g_0$ is the capacitor gap (3.0 μm) at zero volts. The calculated and measured pull-in voltages are provided in Table 1 (See FIG. 8).

Figure 6A:
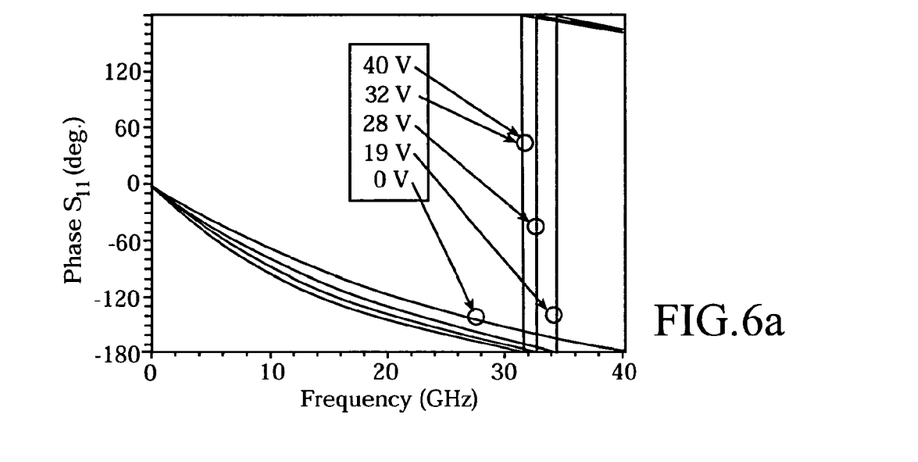
FIGS. 6a and 6b respectively show an S-parameter magnitude and phase for all four states of the cantilevers included on the digital variable capacitor package of FIG. 1.
Figure 6B:
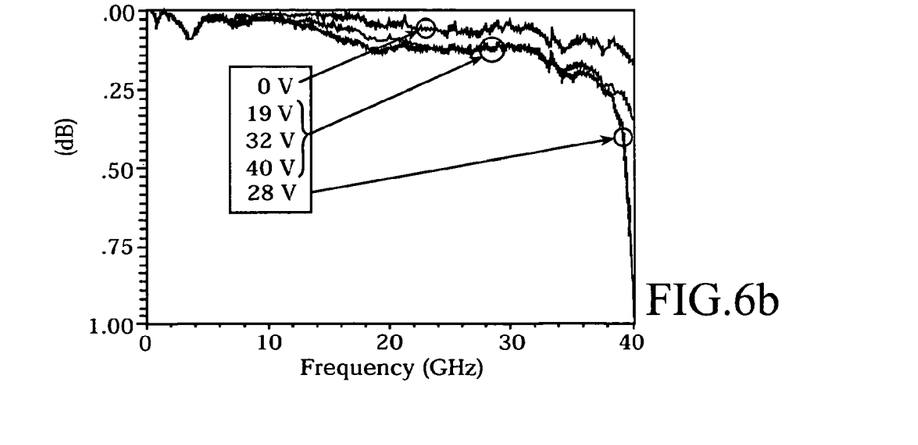

FIGS. 6a and 6b respectively show the S-parameter magnitude and phase for all four states: 0V—all up, 19 V—1 down, 28 V—2 down, 32 V—all down, 40 V—all down. The magnitudes of all the states are almost identical except for the all up state which has the lowest loss, and the 2 down (28V) state which shows an increased loss around 40 GHz. Furthermore, shown is the measured magnitude and phase for all four states and five voltages. As can be seen, the four states are clearly defined while the two measurements (32V and 40V) in the all capacitor down state are virtually identical. In addition to S-parameters, phase versus time measurements were taken at a fixed frequency of 20 GHz. These measurements were taken with the same set up, however instead of a DC bias, a low frequency (f<2 Hz) triangle wave with a 0-40 V amplitude may be applied to the capacitor regions 26, 28, 30 (FIG.

1). Over a 5 second interval, the phase of S11 maybe recorded. This measurement, allows the generation of a phase versus voltage plot by matching the known bias voltage up with the measured phase value. Further, this measurement provides a good method for showing all four capacitive states.

Figure 7:
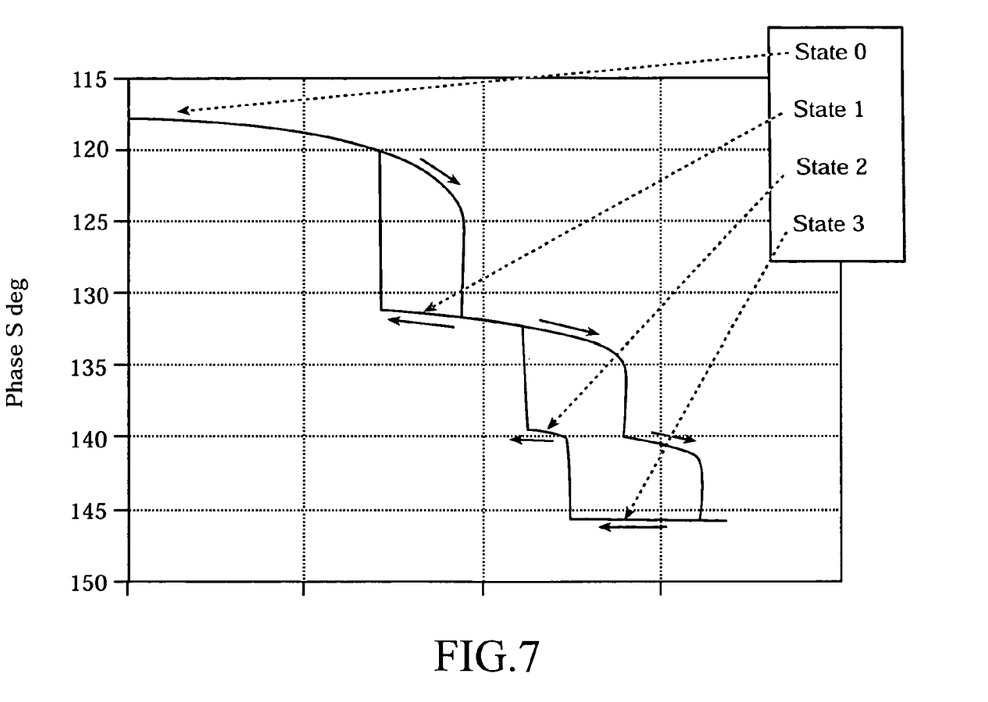
FIG. 7 shows a graph representing four possible digital capacitance states of the digital variable capacitor package of FIG. 1.

FIG. 7 shows the phase versus voltage plot that is derived from this measurement. All four states are clearly defined, and the pull-in voltages are spaced reasonably well.

The digital variable capacitor 10 of the present invention may be of interest to microwave circuit designers because it provides a higher quality factor (Q>100) than other integrated reactive tuning devices (Q<50) at frequencies above XX GHz. In addition, the digital variable capacitor 10 has been shown to have high capacitance ratios (>1.5) and relatively high self-resonant frequencies (>40 GHz). Further, the digital variable capacitor package 10 includes exceptional linearity with respect to microwave signal power. The overall high performance of this device is very promising for applications including voltage controlled oscillators, tunable filters, and tunable matching networks.

The digital variable capacitor 10 of the present invention may be widely used in microwave and wireless systems as reactive tuning elements. Furthermore, the digital variable capacitor 10 may be employed as a tuning element for a voltage controlled oscillator. Varying the capacitance in the circuit varies the center frequency of the oscillator. Another common example may include using the digital variable capacitor 10 in phase shifters for phased array antennas. Yet another example is the use of the digital variable capacitor 10 in tuning circuits for matching an input feed to an antenna over a wide bandwidth.

The digital variable capacitor 10 of the present invention may also be used for applications at frequencies in the microwave to millimeter-wave frequency ranges. Of particular value is the discrete capacitance state which is provided by sequentially actuating each of the first, second and third cantilevers 20, 22, 24. In applications such as radar, the performance of the system is very sensitive to phase variations in elements such as the phase shifter.

As compared to traditional variable capacitors, the digital variable capacitor 10 of the present invention offers a good tuning ratio, relatively high Q, and discrete capacitance states. The tuning ratio of 1.7:1 can be improved significantly by increasing the initial air gap, or decreasing the final landing height. These changes are readily implemented and allow designers a greater degree of freedom than traditional designs. The high Q of this device is inherent to the metal air metal capacitor design. The thick metal layer and compact size provide very low losses. This directly translates into improved performance when integrated into systems. Finally, the discrete capacitance states, have significant potential impact in areas where phase noise is a critical parameter, specifically radar.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A method of forming a digital variable capacitor, comprising:
   (a) disposing and patterning a relatively thin metal layer on a relatively thick wafer substrate to form a signal electrode and a ground plane region including a notched region;
   (b) disposing and patterning a sacrificial layer over portions of the signal electrode and the ground plane region;
   (c) etching a dimple in the sacrificial layer over and substantially aligned with the notched region defined on the ground plane region;
   (d) disposing a relatively thick metal layer over the signal electrode and the sacrificial layer; and
   (e) etching away the sacrificial layer including the dimple for forming at least one cantilever having a first end coupled to the signal electrode and a second end suspended over a predetermined portion of the ground plane and including a protrusion formed on a bottom surface of the second end having a position and dimension corresponding to a position and dimension of the dimple formed in the sacrificial layer and the protrusion being substantially aligned with the notched region defined on the ground plane so that the protrusion can be positioned into the notched region to contact the substrate for providing a positive downward stop for the second end of the cantilever, wherein the signal electrode is adapted to receive one or more control values operative to actuate the at least one cantilever to position the second end of the at least one cantilever in relative close proximity to the ground plane as defined by the protrusion being positioned into the notched region of the ground plane to contact the substrate for providing at least a first predetermined capacitance between the signal electrode and the ground plane.

2. The method of forming a digital variable capacitor of claim 1, wherein step (a) further includes disposing and patterning a relatively thin gold metal layer on the relatively thick wafer substrate to form the signal electrode and the ground plane region including the notched region.

3. The method of forming a digital variable capacitor of claim 2, wherein step (a) further includes using an evaporation process for disposing the thin gold metal layer.

4. The method of forming a digital variable capacitor of claim 3, wherein step (a) further includes using a lift off process for patterning the thin gold metal layer.

5. The method of forming a digital variable capacitor package of claim 1, wherein step (b) further includes disposing and patterning the sacrificial layer including a layer of polymethylglutarimide (PMGI) over portions of the signal electrode and the ground plane region.

6. The method of forming a digital variable capacitor of claim 5, wherein step (b) further includes disposing the layer of PMGI over portions of the signal electrode and the ground plane region using a spin coating process and permitting the PMGI to cure.

7. The method of forming a digital variable capacitor in of claim 6, wherein step (b) further includes patterning the layer of PMGI using a photo-lithographic process.

8. The method of forming a digital variable capacitor of claim 1, wherein step (c) further includes etching the dimple using a photolithographic process to a depth of approximately one micrometer.

9. The method of forming a digital variable capacitor of claim 1, wherein disposing the relatively thick metal layer includes disposing a relatively thick gold layer using an electroplating process.

10. The method of forming a digital variable capacitor of claim 1, wherein step (e) further includes etching away the sacrificial layer using PMGI stripper for forming the at least one cantilever.

* * * * *